United States Patent [19]

Main

[11] Patent Number: 5,521,946
[45] Date of Patent: May 28, 1996

[54] MULTI-PHASE FILTER/DAC

[75] Inventor: David R. Main, Boulder Creek, Calif.

[73] Assignee: The 3DO Company, Redwood City, Calif.

[21] Appl. No.: 178,963

[22] Filed: Jan. 7, 1994

[51] Int. Cl.[6] ................................................ H04B 1/10
[52] U.S. Cl. ................................ 375/350; 375/373
[58] Field of Search .................. 375/229, 230, 375/343, 350, 371, 373, 232, 260, 236, 337, 346, 348; 364/724.1; 370/72, 123; 331/32, 36 R, 36 C

[56]              References Cited

U.S. PATENT DOCUMENTS

| | | | |
|---|---|---|---|
| 4,044,241 | 8/1977 | Hatley, Jr. | 375/350 |
| 4,468,794 | 8/1984 | Waters et al. | 375/350 |
| 4,733,403 | 3/1988 | Simone | 375/350 |
| 4,922,509 | 5/1990 | Tresset et al. | 375/350 |
| 5,241,544 | 8/1993 | Jasper et al. | 370/105.3 |
| 5,243,624 | 9/1993 | Pair et al. | 375/232 |
| 5,278,872 | 1/1994 | Greenberg | 375/350 |
| 5,293,398 | 3/1994 | Hamao et al. | 375/343 |
| 5,343,496 | 8/1994 | Honig et al. | 375/350 |
| 5,379,223 | 1/1995 | Asplund | 375/327 |

OTHER PUBLICATIONS

"Analog Filter Design for Video A/D and D/A Converters", Brooktree Corporation, Application Note 35 (1993).

Primary Examiner—Young T. Tse
Attorney, Agent, or Firm—Fliesler, Dubb, Meyer & Lovejoy

[57]             ABSTRACT

Apparatus and method for use with a sampled input signal having an input sampling frequency $F_S$. The apparatus including M digital filters, each receiving the input signal, each having a respective transfer characteristic $h_m[n]$ and each producing a respective output signal updated at the input sample rate $F_S$, each m'th one of the filters updating its output signal in response to a respective m'th phase of the input sample clock, $M \geq 2$. The apparatus then combines the output signals of the digital filters to produce a combined output signal having a sample rate of at least $MF_S$. The apparatus may also be viewed as a hybrid digital/analog filter. The method includes steps of receiving the sampled input signal, filtering the sampled input signal through P filters, combining the outputs of the P filters to produce M output signals, $1 < M \leq P$, each m'th one of the M output signals being updated in time for respective m'th one of the phase of the input sampling frequency $F_S$, and combining the M output signals to produce a combined output signal having a sample rate of at least $MF_S$.

37 Claims, 7 Drawing Sheets

MULTI-PHASE FILTER/DAC

BACKGROUND OF THE INVENTION

There are competing objectives in most digital signal processing (DSP) systems which have digital-to-analog converter (DAC) output stages that re-convert a digitally processed signal to an analog signal. On the one hand one wants to keep the system inexpensive and simple, but on the other hand one wants a high performance system. To achieve minimal expense a DSP system uses as low a data sample rate as possible and uses as simple an analog re-construction filter as possible. To achieve higher performance one uses as high a data sample rate as possible and uses a relatively complex analog reconstruction filter. The higher the data sample rate the less the data high frequency components will be attenuated by Sin(x)/x effects and the higher (i.e. easier to filter out) the sampling alias noise product frequencies will be. However, higher data sampling frequencies require more expensive digital circuitry and a higher performance DAC, both of which contribute to cost. The more complex the analog reconstruction filter the more it can avoid phase and amplitude distortion in the reconstructed analog signal and the more it can avoid alias noise product energy contaminating the output signal. As a consequence of the traditional compromises in these factors it is typical that there will be, especially in consumer grade applications, noticeable high frequency attenuation and group delay distortion in the output signal. There will also be more alias noise product energy in the output than would be desirable if cost were not a factor. Even with these degradations in performance, the reconstruction filters still tend to be relatively large, expensive, and awkward to manufacture relative to the other circuits in a DSP system.

Conventionally, the problems described above are addressed by compromising signal quality or compromising economy. The zero sum nature of these competing goals has not been easily avoided. In digital audio systems some benefit has been derived by using 1-bit DACs operating at very high frequencies. A 1-bit DAC is a DAC whose digital input port is only one bit wide, and which provides its output as an oscillating signal having a duty cycle which varies in response to the input value. Such 1-bit DACs have allowed much simpler filters to be used, but at the expense of dramatically more digital circuitry. In video DSP systems such a solution has not been possible because the 1 bit DAC would have to operate at such high frequencies as to be impractical with low cost commercial technology.

SUMMARY OF THE INVENTION

The invention described herein can significantly attenuate the alias noise product energy caused by the DAC sampling process. Roughly described, apparatus for use with a sampled input signal has an input sampling frequency $F_S$, the samples of the input signal occurring in coordination with an input sample clock. The apparatus includes M digital filters, each receiving the input signal, each m'th one of the filters having a respective transfer characteristic $h_m[n]$ and producing a respective output signal updated at the input sample rate $F_s$, each m'th one of the filters updating its output signal in response to a respective m'th phase of the input sample clock, $M \geq 2$. The apparatus also includes means for combining the output signals of the digital filters to produce a combined output signal having a sample rate of at least $MF_S$. The means for combining the output filters can perform linear combinations only (e.g. equally or unequally weighted sums), or optionally can include other functions such as overflow and underflow clamping.

In one aspect of the invention, subsequent to the normal DSP signal processing, either a single DAC operating at twice normal frequency ($2F_S$) or, in a preferred architecture, two DACs each operating at the normal (traditional method) frequency ($F_S$) are used. The data samples are interpolated using a very simple circuit to produce a data sequence with substantially the same signal content as would be produced by a traditional DAC method, but at twice the sample rate. The reconstructed analog signal will have alias noise product energy beginning at approximately twice the traditional frequency, making it dramatically simpler to filter out with a low cost analog reconstruction filter. Because the filter need not have nearly as steep a cut-off, it is both cheaper and has less amplitude and group delay distortion effect on the analog signal. The alias noise product energy at the uninterpolated data sample rate $F_S$ is highly attenuated, with the exact attenuation dependent on clock duty cycle.

One embodiment of the present invention violates traditional DSP thinking by using both edges of the synchronous DSP system sample clock. Since the signal to be reconstructed need pass through only a very simple interpolation circuit there does not need to be the stringent clock usage rules as are used in the primary DSP circuitry. It is possible to design an interpolation circuit which requires no further signal processing of the data from the point where counter-phase clocked operation begins (e.g. a synchronous DSP system using the positive clock edge passes data into a register which feeds directly into a register clocked with the negative clock edge, with no gates in between the registers). In the optimum situation the clock will have a 50% duty cycle, in which case each double frequency conversion of the DAC(s) will be of identical duration. As the duty cycle is distorted from 50%, the attenuation of the alias noise product energy at $F_S$ diminishes but still remains significant. The invention does not require a higher frequency system clock, which may not be conveniently available in some DSP systems. The preferred two DAC embodiment instead uses both phases of the normal frequency clock.

In the case of the single DAC implementation the DAC is similar to that which would be used in a traditional DSP output architecture, except that where the $F_S$ clock has a 50% duty cycle, the DAC should be constructed to be able to operate at $2F_S$. If the sample rate clock or the circuitry which processes it into a double rate clock causes unequal sample durations at the DAC (e.g. the clock duty cycle deviates from 50%), the DAC should be constructed to be able to operate at a higher conversion rate corresponding to the minimum $F_S$ half-cycle sample duration.

In the case of multiple- (typically two-) DAC implementations each DAC is typically of lesser full scale current than would be used in a traditional architecture. In cases where the interpolation function requires negative impulse response characteristics (e.g. the negative lobes of a Sin(x)/x interpolator), some DACs may have their polarities reversed. In a preferred implementation of the two-DAC architecture the full scale current of the DACs are exactly one half that of a DAC in a comparable traditional architecture. This suggests that there is virtually no penalty in integrated circuit chip area in such embodiments since half full scale current DACs are approximately one half size owing to their use of transistors which are half as big (since transistor current carrying capacity is approximately proportional to transistor size). Because the multiple-DAC architectures use smaller full scale DAC currents their transition "glitch" energies are half as great and occur at two or more times the frequency as in traditional architectures. This makes glitch energies easier to filter out and subject to better statistical averaging of glitch integral energy. Because the DACs in a multiple-DAC architecture transition at different times and are smaller than normal, the power supply switching noise modulation is reduced.

The conversion rate for each DAC in the multiple-DAC architecture is the same as for traditional methods, the system clock frequency $F_S$. With more than one clock phase (typically two, although linear phase shifting of the clock can produce more than two clock phases for more complex interpolation transfer functions), the individual DAC conversion rates remain constant, with DAC conversion states overlapping those of other DACs.

In multiple-DAC architectures the interpolator can have a larger number of effective taps than DACs by digitally summing and using a single DAC for those quantities which would otherwise be clocked with the same clock phase and separate DACs. This method, for instance, allows a three-tap interpolator transfer function to use only two DACs in the preferred embodiment.

In the case of a preferred two-DAC 25 MHz sampling rate video DSP system embodiment, the traditional three- to seven-pole passive reconstruction filter using precision inductors, capacitors, and resistors can be replaced by a single wide tolerance capacitor and the load resistance forming a single pole analog RC filter. The group delay distortion of the traditional filter, manifested as "ringing" at high amplitude abrupt signal transitions, is eliminated by the hybrid digital and analog finite impulse response (FIR) filter method and single pole RC analog low-pass filter used in the described embodiment.

BRIEF DESCRIPTION OF THE DRAWINGS

The invention will be described with respect to particular embodiments thereof and reference will be made to the drawings, in which.

DETAILED DESCRIPTION

In the past, DACs have traditionally been inflexible "scarce resources" which had to be used sparingly. Because they were relatively expensive there was little incentive to use two when one would suffice. It has, historically, been cheaper to buy more expensive filters than multiple DACs. The invention recognizes, however, that with the advent of advanced integrated circuit technology this paradigm no longer holds true. It is virtually the same system cost to use two DACs fabricated to have half the full scale current as it is to have a single full-scale current DAC. The desire is to minimize-total system cost, and this typically means minimizing component count. By integrating a solution to DSP reconstruction on an integrated circuit, it is possible to remove multiple discrete components that would traditionally be associated with a DSP DAC. This is more economical at a system level. The fact that it can dramatically improve performance is so much the better.

Aspects of the invention use counterphase (i.e. both rising and falling transition) clocking in a synchronous system. While counterphase clocking has been used in certain specialized applications, for example in order to generate fine timing gradations for the control of dynamic random access memory (DRAM), this would be a formula for race condition disasters if it were used in the middle of most DSP systems. Used at the output of the system, however, there is no system throughput degradation (with the possible exception that a single DAC embodiment must accommodate a conversion speed dictated by the shortest half cycle of the system clock). The counter-intuitive use of the system clock in an unconventional manner can be tolerated when no digital circuitry synchronous to the standard clock edge need process data which is produced in response to the opposite clock edge.

Figure 1:
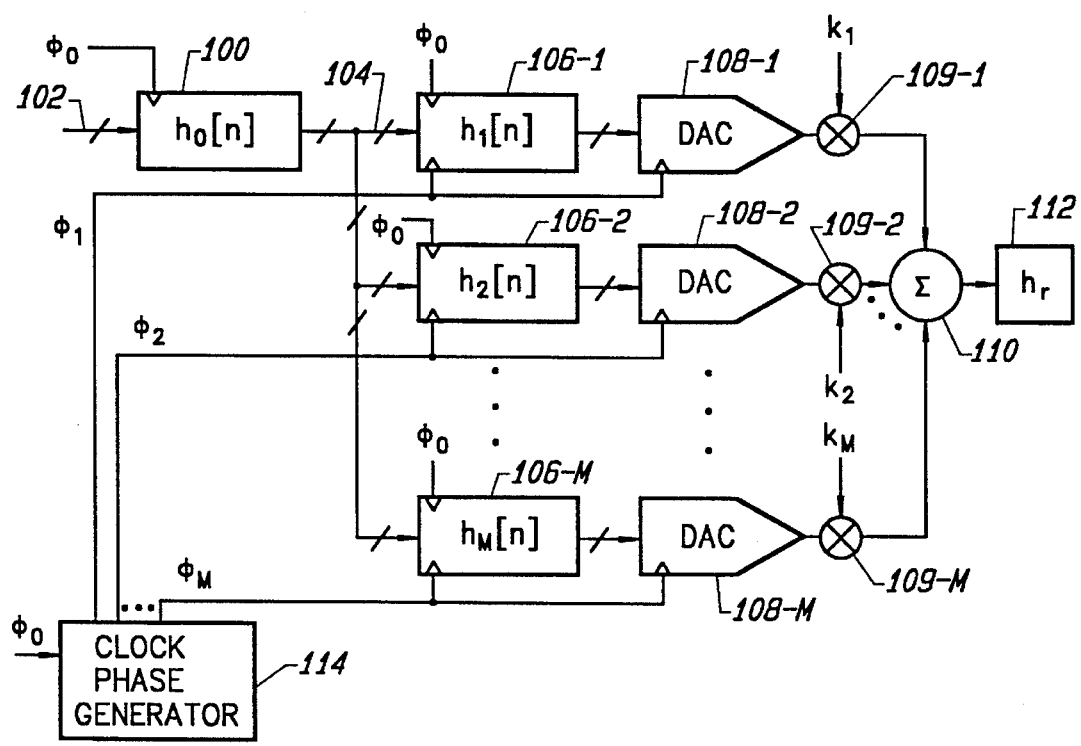
FIGS. 1, 6 and 8 are functional block diagrams of apparatus according to the invention.

FIG. 1 is a functional block diagram of apparatus according to the invention. It comprises an initial filter 100 (having an impulse response $h_0[n]$) which receives the digital output of prior circuitry over a bus 102 at a sampling rate $F_S$. In a particular embodiment, filter 100 may constitute a mere passthrough; it is included in FIG. 1 merely to indicate that the overall filter/DAC system may include common filtering functions prior to being split up into different clock phases.

The output of filter 100 is provided over a bus 104 to the data input ports of M further filters 106-1, 106-2 ... 106-M (collectively 106). Each m'th one of the filters 106-m has an impulse response $h_m[n]$.

The output of each of the filters 106-m is provided to the digital input port of a respective DAC 108-m (collectively 108), the analog outputs of which are multiplied by a respective weight $K_m$ by a respective analog multiplier 109-m (collectively 109). The multiplier 109 outputs are summed by a summer 110 and provided to an output reconstruction filter 112. If the multiplier 109 outputs are in the form of current level outputs, for example, the summer 110 can be simply a current summing node. The reconstruction filter 112 has a transfer function $h_r$, and its output forms the output of the system of FIG. 1. Note that each of the DACs 108-m can also include a respective reference input, and these reference inputs can implement the analog multiplication shown in the Figure as being performed by multipliers 109. The DACs 108 conventionally multiply the value on the reference inputs by the digital input values in order to produce their analog output values. Note further that the values of the $K_m$ can be made variable, as for adaptive filtering applications.

The filter 100 is clocked with a system clock signal $\phi_0$. The clock signal $\phi_1$ has alternating rising and falling clock edge transitions, one of which is considered to be an "effective" edge. For convenience, the effective edge of the clock signal $\phi_0$ is considered herein to be the rising edge; but it will be appreciated that other embodiments can use the falling edge of a clock signal as the effective edge. The rising edge of $\phi_0$ is considered to be the effective edge because the prior circuitry updates its output in response to each of such rising edges, and because the prior circuitry is designed in such a manner that each sample arriving on bus 102 is valid by the time the next rising edge of $\phi_0$ occurs and is held for a minimum "hold" time subsequent to the effective edge of $\phi_0$. The clock $\phi_0$ has the same frequency as the input sample frequency $F_S$.

Each of the filters 106-m are clocked by respective clock phase signals $\phi_m$, as are their respective DACS 108-m. The clocked DACs illustrated herein are merely flash DACs (which are unclocked) preceded by a clocked register. Note that if flash DACs are used without the preceding register, such DACs obviously would not need to receive any clock phase. The clock phase signals $\phi_m$ are generated by a clock phase generator 114 which divides the input clock signal $\phi_0$ into M phases. For example, a conventional phase lock loop-based circuit can produce these phases. Clock signal $\phi_0$ often can be identical to the input clock signal $\phi_0$, possibly but for a slight time shift introduced by the clock phase generator 114. The clock phases $\phi_m$ preferably divide each clock period equally, but this is not essential. For example, where M=2, $\phi_1$ may be $\phi_0$ identically and the rising edges of $\phi_2$ may be produced merely in response to each falling edge of $\phi_0$.

Each of the clock phases $\phi_m$ operate at frequency $F_S$, so none of the filters 106 need operate at a higher frequency than $F_S$. The DACs 108 also ordinarily need not operate at a higher frequency than $F_S$.

While it is possible to-describe the impulse response $h_m[n]$ of each of the filters 106 as the sequence of output samples occurring at a rate $F_S$, it is more convenient to describe such impulse responses as the sequence of output samples measured at a rate $MF_S$. Typically each output sample will then be indicated as repeating M times, but representing them at $MF_S$ permits the offset between the clock phases $\phi_m$ of different filters 106 to be reflected in the description of the different individual and aggregate impulse responses. Such an offset would appear as a number, less than M, of leading 0's. For example, if filter 106-1 has an impulse response at $F_S$ of {1, 1, 0}, then its impulse response at $MF_S$, for M=2, is $h_1[n]$ ={1, 1, 1, 1, 0}. If the impulse response of filter 106-2 is the same as that of filter 106-1, then since it is delayed by one clock phase relative to that of filter 106-1, the impulse response of filter 106-2 can be represented as {0, 1, 1, 1, 1} at sample rate $MF_S$. There would be no convenient way to represent such an impulse response at the sample rate $F_S$. Accordingly, impulse responses described herein are described at a sampling rate $MF_S$, with leading 0's as necessary to permit their coordination relative to a common impulse input.

Figure 7:
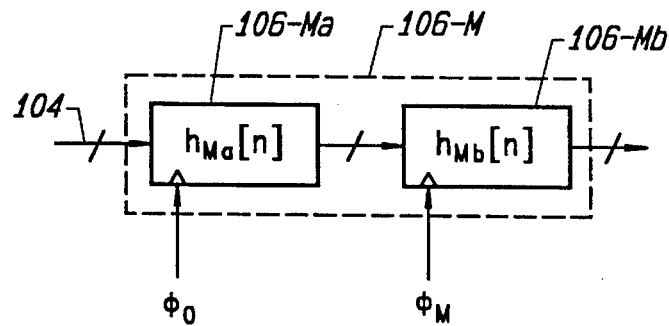
FIG. 7 is a functional block diagram of a filter shown in FIG. 1.

The filters 106 are each shown in FIG. 1 as receiving not only a respective clock phase $\phi_m$, but also 40. FIG. 7 is a detail of one of the filters 106-m in FIG. 1. It can be seen that the filter 106-m is actually divided into an initial filter portion 106-ma, having an impulse response $h_{ma}[n]$, and a subsequent portion 106-mb, having an impulse response $h_{mb}[n]$. The initial portion of each filter 106-m may actually be clocked on 40, as long as any processing which occurs between the last register clocked on $\phi_0$ and the first register clocked on $\phi_m$, is fast enough to guarantee that all set-up and hold requirements are met in the time between the effective edges of $\phi_0$ and $\phi_m$. More precisely, therefore, the filters 106 can be said to update their output values in time for each effective edge of $\phi_m$. Note that a given one of the filters 106-m may not take advantage of the ability to have an initial portion 106-ma clocked on $\phi_0$, in which case $h_{ma}$ would simply be a pass-through.

For some aspects of the invention, as will be seen, the use of different clock phases for the filters 106 and DACs 108, and even the avoidance of higher frequency operation than $F_S$, are unnecessary. Specifically, an aspect of the invention described subsequently herein, involves the use merely of parallel filters followed by parallel DACs which are subsequently summed in the analog domain. That aspect of the invention makes no restriction on the clocking frequencies or phases.

The overall filter function performed by the filters 106, DACs 108, multipliers 109 and summer 110 can be described as:

$$h[n] = \sum_{m=1}^{M} K_m h_m[n]$$

Figure 2:
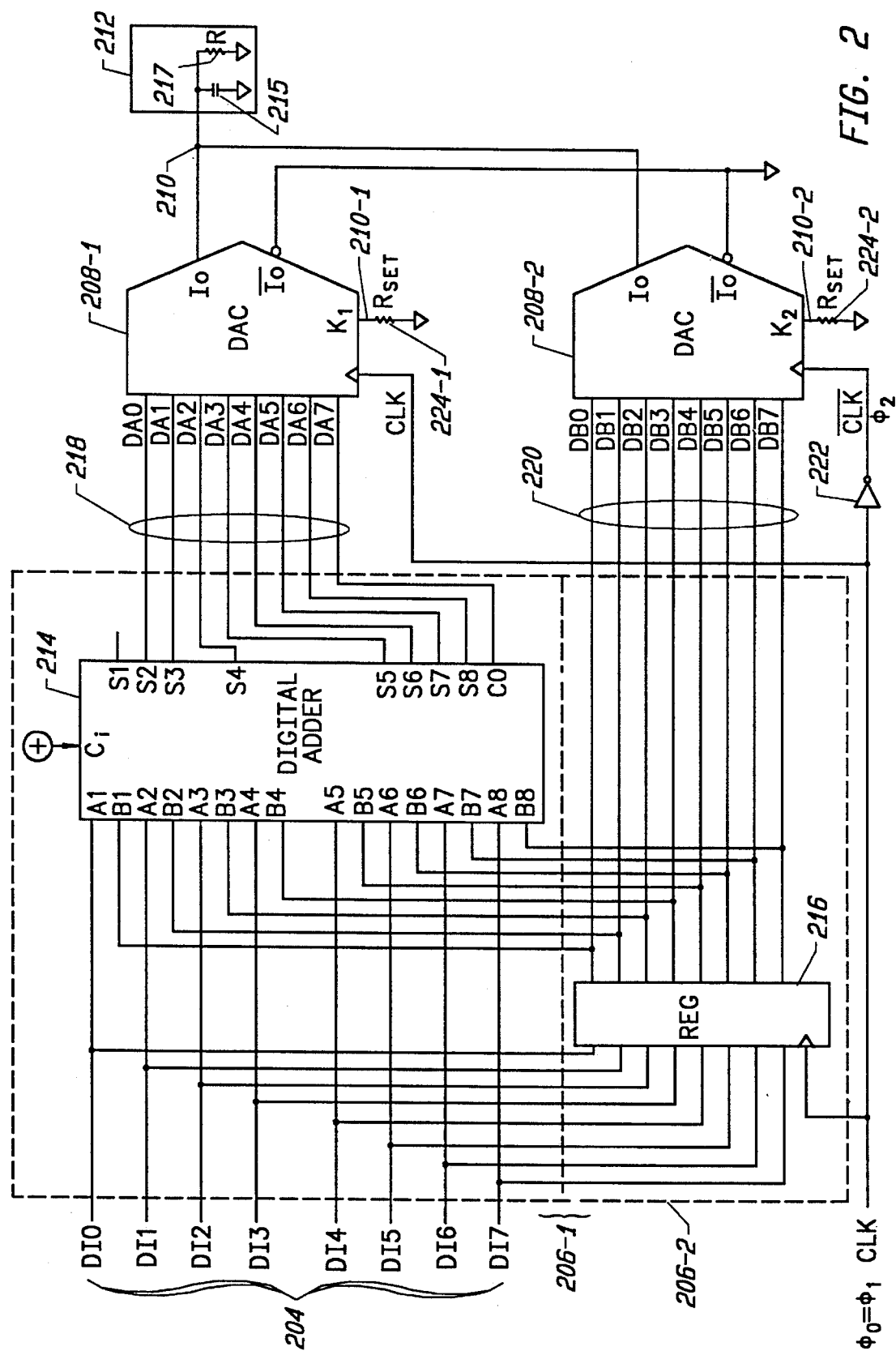
FIG. 2 is a block diagram of a simple filter/DAC system incorporating the invention.

FIG. 2 is block diagram of a simple filter/DAC system incorporating the invention. Conventionally, interpolation from $F_S$ to $MF_S$ is a digital (only) operation. The embodiment of FIG. 2 makes interpolation a hybrid process at the interface between digital and analog domains, taking advantage of the benefits of each.

In the case of the illustrated two-DAC embodiment, a three-tap FIR interpolator is created with an impulse response of:

{0.125, 0.375, 0.375, 0.125}.

This is a coarse approximation of either a Sin(x)/x interpolator or a linear interpolator (with only three taps to the interpolator they are about the same), and has a frequency response notch at the input sample frequency $F_S$. Each output state lasts one half of the DSP system clock period $1/F_S$ (approximately equal duration for all states).

This filter can be alternatively viewed as having an impulse response of:

{0.125, (0.125+0.25), (0.125+0.25), 0.125}, in which it can be seen that the middle two states sum to the original values. This impulse response can be further alternatively viewed as being two summed sequences:

{0.125, 0.125, 0.125, 0.125} and

{0, 0.25, 0.25, 0} in which the top sequence, corresponding to one of the two DACs in FIG. 2, can be inspected to be two full cycles of the DSP system clock $F_S$, and the bottom sequence, the other FIG. 2 DAC, is also one full cycle but time shifted half a cycle of $F_S$ later than the former sequence. Having made these observations it is simple to construct an actual interpolator circuit using M=2. Specifically, the upper impulse sequence is one-eighth the sum of the input and output of a D resister clocked by the system clock. The lower sequence is one quarter of a properly delayed but unprocessed data sample. Such a circuit is illustrated in FIG. 2.

Referring to FIG. 2, the interpolator circuit comprises a first filter 206-1 which receives an 8-bit digital sample input over a bus 204. The filter 206-1 comprises a digital adder 214 having an A input port connected to the bus 204, and a register 216 having an input port which is also connected to the bus 204. Register 216 is clocked with clock signal $\phi_1$, which is here identical to the system clock signal $\phi_0$, at the system clock frequency $F_S$. The output of register 216 is connected to a B input port of digital adder 214. The carry input $C_i$ of adder 214 is connected to receive a logic 1 in order to provide rounding. The output of adder 214 is shifted right by one bit to provide the 8-bit output of filter 206-1 on DA bus 218. That is, the low-order output bit S1 is discarded and the high-order 8 output bits, consisting of the carry output $C_o$ and S(8:2), are provided on the output bus DA(7:0). Thus if full scale is considered to be 0.25, it can be seen that the impulse response of filter 206-1 is:

$h_1[n]=\{0.125, 0.125, 0.125, 0.125\}$.

The system of FIG. 2 also includes a second filter 206-2, which shares the register 216 with filter 206-1. The output of register 216 forms the output of filter 206-2.

While the filter 206-2 appears in FIG. 2 to be clocked on the same clock phase as the filter 206-1, this is only a consequence of the feature, mentioned above, that an initial portion of the filter 206-2 can be clocked on the same clock phase as 206-1 as long as any processing which occurs between the last register clocked on that clock phase and the first register which is clocked on the $\phi_2$ clock phase for filter 206-2 is fast enough to guarantee that all set-up and hold requirements are satisfied. In filter 206-2, there is no processing which occurs between the last register clocked on $\phi_1$ (register 216) and the first register clocked on $\phi_2$ (which, as will be seen, is the input register of DAC 208-2). The fact that filter 206-2 operates on clock phase $\phi_2$ can be seen by the fact that all subsequent clocked circuitry (i.e. DAC 208-2) considers the output of filter 206-2 to be valid and stable on the effective edge of $\phi_2$ rather than $\phi_1$. Accordingly, it can be seen that the impulse response of filter 206-2 for a full scale of 0.25 is given by $\{0, 0, 0.25, 0.25\}$.

The DA output bus 218 of filter 206-1 is connected to the digital input port of a current-output DAC 208-1, the clock input of which is connected to receive $\phi_1$. Similarly, the DB output bus 220 of filter 206-2 is connected to the digital input port of a current-output DAC 208-2, the clock input of which is coupled to receive the second phase $\phi_2$ of the system clock signal. $\phi_2$ is advantageously generated by an invertor 222, the input of which is connected to receive $\phi_1$, since an inverted square wave clock produces a half clock cycle delay of the effective edge as required by M=2. Some clocked DACs can optionally use the counter clock phase edge directly, as in differential logic. These allow use of a single clock in M=2 applications, and do not need clock phase generator 114 (FIG. 1).

DAC 208-1 has a reference input 210-1 which is coupled to ground via a resistor 224-1, and the DAC 208-2 has a reference input 210-2 which is coupled to ground via a resistor 224-2. The resistors 224-1 and 224-2 are equal, so the relative weighting $K_1/K_2$ which the two DACs apply to their current outputs is unity.

Each of the DACs 208-1 and 208-2 has an inverting current output which is connected to ground, and a non-inverting current output which is connected to a common current summing node 210. The summing node 210 is connected to the input of a reconstruction filter 212 which is made up merely of a non-precision capacitor 215 to ground and a resistance 217 made up of the parallel combination of the effective combined impedance of DAC biasing elements and the DAC load impedance (typically non-reactive).

Figure 3:
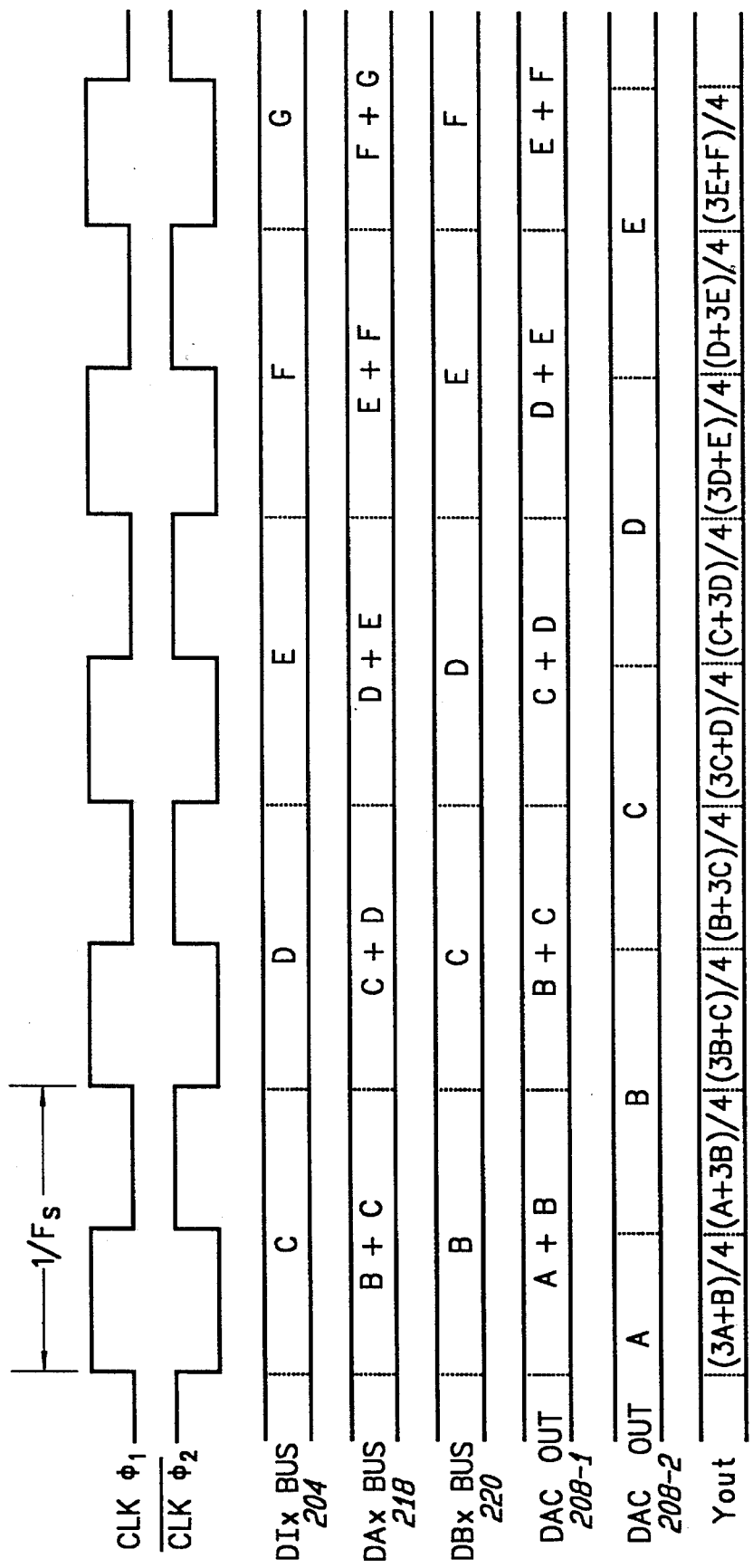
FIG. 3 is a timing diagram illustrating the values which will be present at various points in the system of FIG. 2 in response to certain input values.

FIG. 3 is a self-explanatory timing diagram illustrating the values which will be present at various points in the system of FIG. 2 in response to input values A, B, C, D, . . . occurring at the sample rate $F_S$ on DI input bus 204. The impulse response of the overall system can be determined by setting all of the input values to 0 except for one, for example D, which is set to 1. It can be seen that the sequence of values which result on the line Vout in FIG. 3, expressed at a rate of $2F_S$, is 0, 0, 0, 0, 0.25, 0.75, 0.75, 0.25. Except for a scaling factor of 2, such an impulse response is the same as that set forth above as the desired response for the system.

Figure 4:
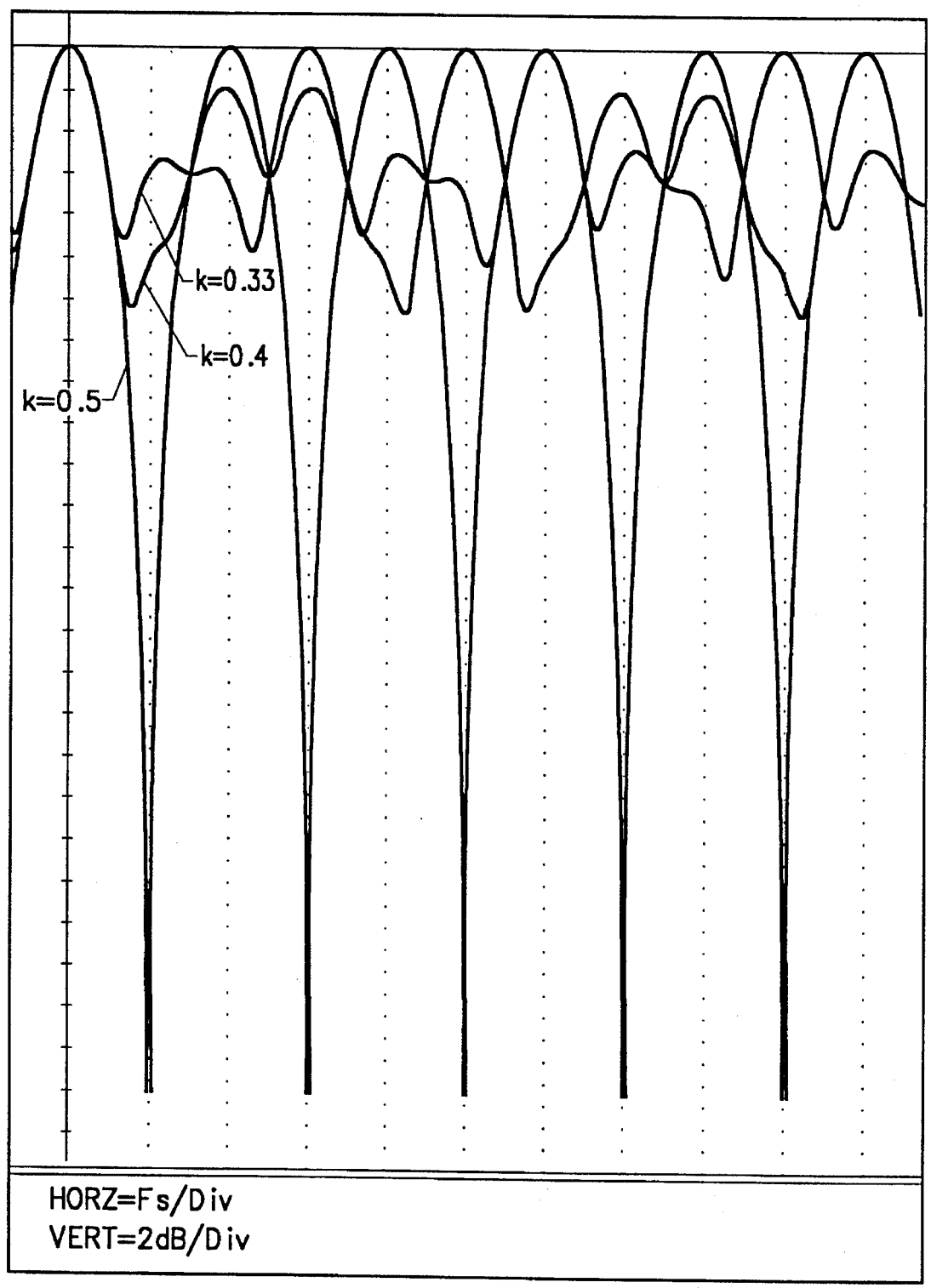
FIG. 4 is a frequency domain plot of the filter output for different duty cycles in FIG. 2.

The embodiment of FIG. 2 derives the effective edge of $\phi_2$ from each non-effective edge of $\phi_1$ (i.e. the counter-phase). If $\phi_1$ has a duty cycle of exactly 50%, then the filter illustrated in FIG. 2 (prior to the reconstruction filter 212) has a deep notch at every positive odd integer multiple of $F_S$, (e.g. 1, 3, 5, 7, . . . ). As the duty cycle of $\phi_1$ deviates from 50%, notch performance also degrades. This can be seen in FIG. 4, which is a frequency domain plot of the filter output $h[n]=h_1[n]+h_2[n]$ for duty cycles k=0.5, k=0.4 and k=0.33. Despite the degradations, however, once sin(x)/x rolloff and the effects of the simple reconstruction filter 212 are taken into account, performance is still very good for these duty cycles relative to the requirements on many commercial applications.

Figure 5:
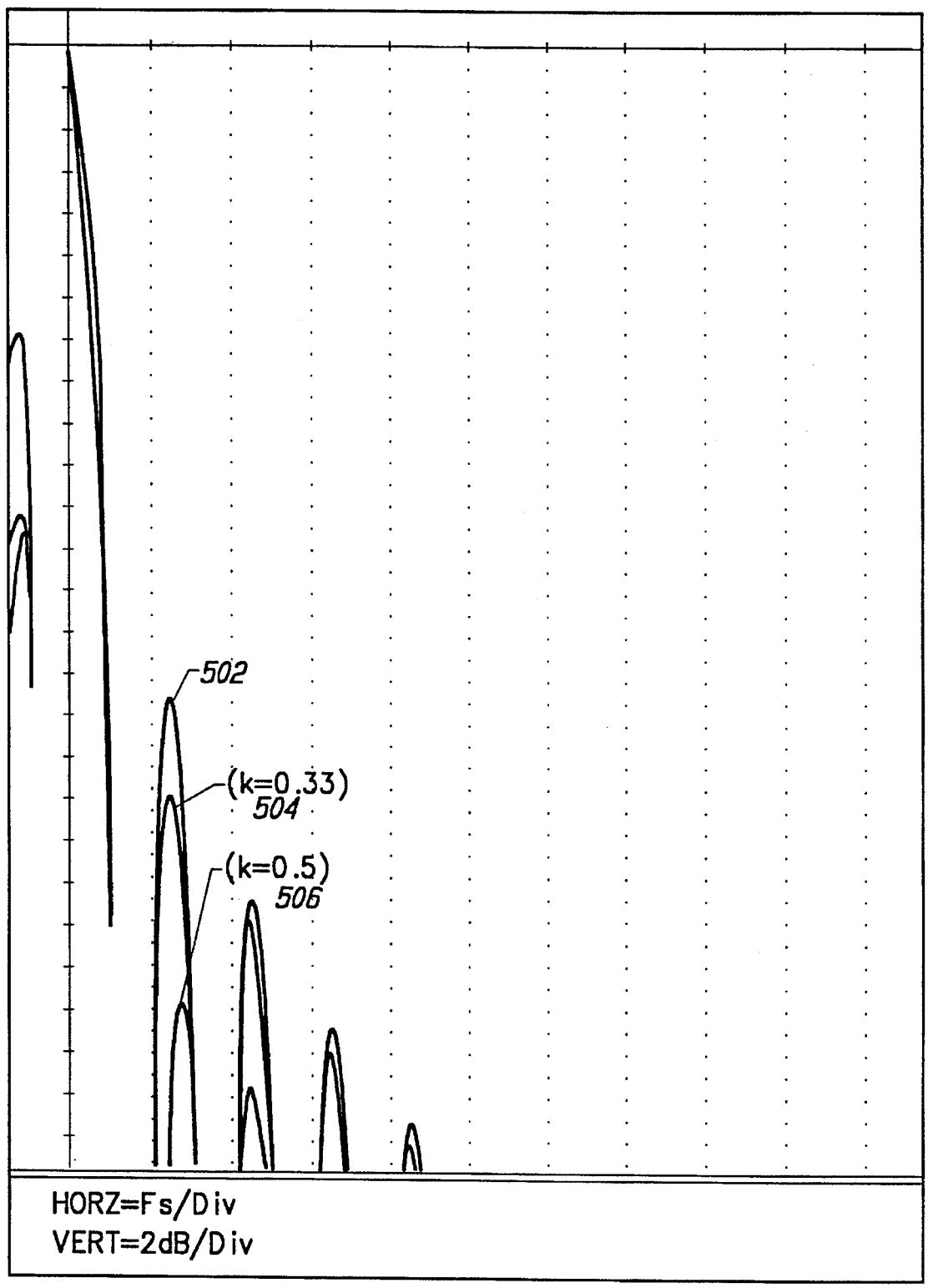
FIG. 5 is a frequency domain plot of the final system output of the system of FIG. 2.

This can be seen in FIG. 5, which is a frequency domain plot of the final system output after sin(x)/x rolloff and the effects of an RC low-pass reconstruction filter having a corner frequency at $F_S/3$ are taken into account. Line 506 in FIG. 5 illustrates the response for a duty cycle k=0.5, and line 504 illustrates the response for a duty cycle k=0.33. It can be seen that although performance is not as good for k=0.33 as for k=0.5, the maximum amplitude outside the desired baseband is still approximately 36 dB down from the response at DC. Thus the duty cycle for this type of embodiment is preferably as close to 50% as possible, although other duty cycles can still yield acceptable performance. For convenience, line 502 in FIG. 5 illustrates the product of the sin(x)/x and RC reconstruction filter response, without the filter/DAC system of FIG. 2.

The phase response of the dual DAC system of FIG. 2 is, as is typical of FIR filters, without group delay distortion. The only phase shifts are caused by the single pole RC reconstruction Low Pass Filter 212 (LPF). Also, the attenuation of alias sample frequency harmonics is periodic, alternate high frequency harmonic sets being attenuated deeply. This can be, in commercial applications, advantageous in meeting FCC RF radiation limits.

As previously mentioned, the invention can also be applied for use with 1-bit DACs. The general structure of such apparatus can be the same as that shown in FIG. 1, where the DACs 108 are 1-bit DACs.

Note that the embodiment of FIG. 2 implements a 3-tap (at $2F_S$) filter using only two DACs 208-1 and 208-2. In a general FIR filter, all the taps are weighted and summed together to provide the output. Using an aspect of the invention, the embodiment of FIG. 2 performs part of the sum in the digital domain prior to the DACs, and part in the analog domain following the DACs. Specifically, the information from the first tap (directly on the input bus 204) is summed by digital adder 214 with the information from the third tap (the output of register 216), and the current summing node 210 adds the result to the information from the second tap (which also derives from the output of register 216). Where one of the filters 208 digitally sums information from more than one tap, the filter can conveniently be thought of as being the sum of several filters ("sub-filters"), one for each such tap. Filter 206-1, for example, which has an impulse response of $\{0.125, 0.125. 0.125, 0.125\}$, can be conveniently considered to be the sum of two sub-filters having impulse responses

{0.125, 0.125, 0, 0}, and

{0, 0, 0.125, 0.125},

Thus the circuitry of FIG. 2 can be thought of as having two filters 206-1 and 206-2, the outputs of which are converted to analog and combined in the analog domain, or alternatively as three filters, the outputs of which are combined partially in the digital domain and partially in the analog domain. In general, the summation of tap values can occur either entirely in the digital domain prior to conversion to analog (in which case only one DAC is needed although it must be able to operate at $MF_S$), or entirely in the analog domain (in which case one DAC would be used for each tap, or partially in the digital domain and partially in the analog domain (in which case more than one and less than M DACs would be used). The embodiment of FIG. 2 minimizes the number of DACs required, while at the same time avoiding a necessity for the DACs to operate at a frequency higher than $F_S$, by selecting and summing digitally all of the taps of the filter which occur on the same clock phase.

Figure 6:
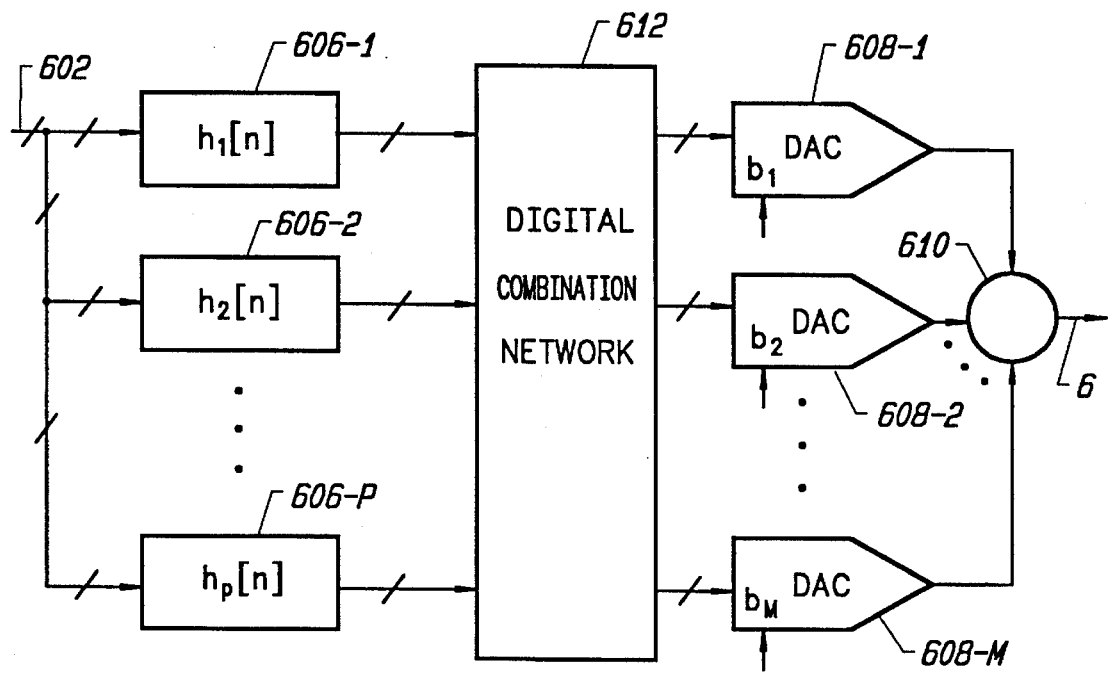

The view of the invention as a hybrid digital/analog filter/DAC is illustrated more generally in FIG. 6. Referring to FIG. 6, the sampled digital input signal arrives on bus 602 and is provided to the input ports of each of P digital filters 606-p (collectively 606). Each of the filters 606-p has an impulse response $h_p[n]$. The outputs of the filters 606 are all provided to a digital combination network 612 which has P input ports and M output ports, and each of the output ports are connected to the digital input port of a respective DAC 608-m. The analog outputs of the DACs 608 are combined (typically summed) by an analog combination network 610 to provide the output of the filter/DAC on line 614. As with the DACs 108 in FIG. 1, the DACs 608 in FIG. 6 can also include a respective multiplying reference input value $b_m$.

The number of DACs M is greater than one but less than or equal to the number of filters P. Thus part of the combining of the filter 606 outputs can be performed digitally in digital combination network 612, with the remainder being performed in the analog domain in the analog combination network 610. A combined overall filter characteristic results. For example, if M=P−1, then the digital combination network 612 might consist of a single adder which adds together the outputs of two of the filters 606 to provide the digital input to one of the DACs 608, each of the remaining filter 606 outputs being passed through the digital combination network 612 to a respective one of the other remaining DACs 608. As another example, if M=P−2, then the digital combination network 612 might consist of two adders, each receiving a respective pair of the filter 606 outputs to provide the input value for a respective one of the DACs 608, each of the filter 606 outputs which is not provided to one of the adders being passed through the digital combination network 612 to a respective one of the DACs 608 which does not receive the output of one of the adders. Alternatively, with M=P−2, the digital combination network might consist of a single 3-input adder, the input ports of which receive the outputs of three respective ones of the filters 606. The output of such an adder would then be provided to the input of one of the DACs 608, and all of the filter 606 outputs which are not coupled to an adder input would instead be coupled to the input of a respective one of the DACs 608 which are not coupled to the adder output. Note that the digital and analog combination networks 612 and 610 can perform other linear operations as well, such as filter tap weighting or gain scaling. They can also perform nonlinear operations, such as clipping. (The term "linear" is used herein in its mathematical sense.)

The view of the invention illustrated in FIG. 6 can be correlated with the embodiment shown in FIG. 2. That embodiment implements three filters 606-1, 606-2 and 606-3, one corresponding to each of the taps of the 3-tap filter. Thus the three filters have respective impulse responses as follows:

$h_1[n]$={0.125, 0.125, 0, 0}

$h_2[n]$={0.0.25, 0.25, 0}

$h_3[n]$={0, 0, 0.125, 0.125}.

The digital combination network 612 comprises, in FIG. 2, the digital adder 214, which adds the outputs of the $h_1[n]$ and $h_3[n]$ filters and provides half the result (via the shift-right) to the first DAC 208-1; and the bus 220, which passes the output of the $h_2[n]$ filter through to the second DAC 208-2. In this case M=2, P=3, and M=P−1.

The overall impulse response of the generalized apparatus of FIG. 6 is $$h[n] = \sum_{m=1}^{M} K_m h_m[n],$$

where the $K_m$'s are cascaded analog and digital combination weights.

It should be noted that the analog output signal on line 614 of FIG. 6 steps from each value to the next in accordance with the clock signal. It is therefore still considered to be "sampled" for the purpose of describing the overall filter response.

Figure 8:
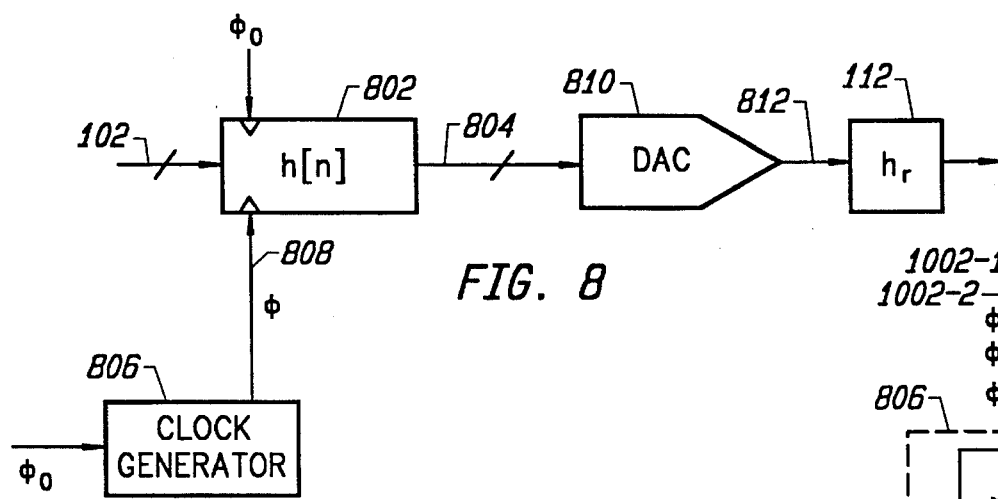
Figure 10:
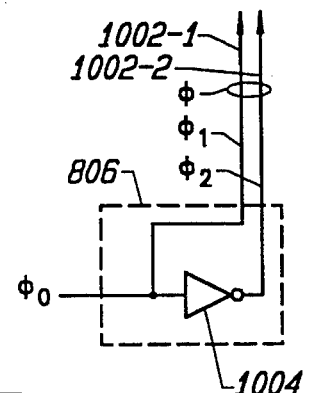
FIG. 10 is a logic diagram of an implementation of the clock generator of FIG. 8.
Figure 9:
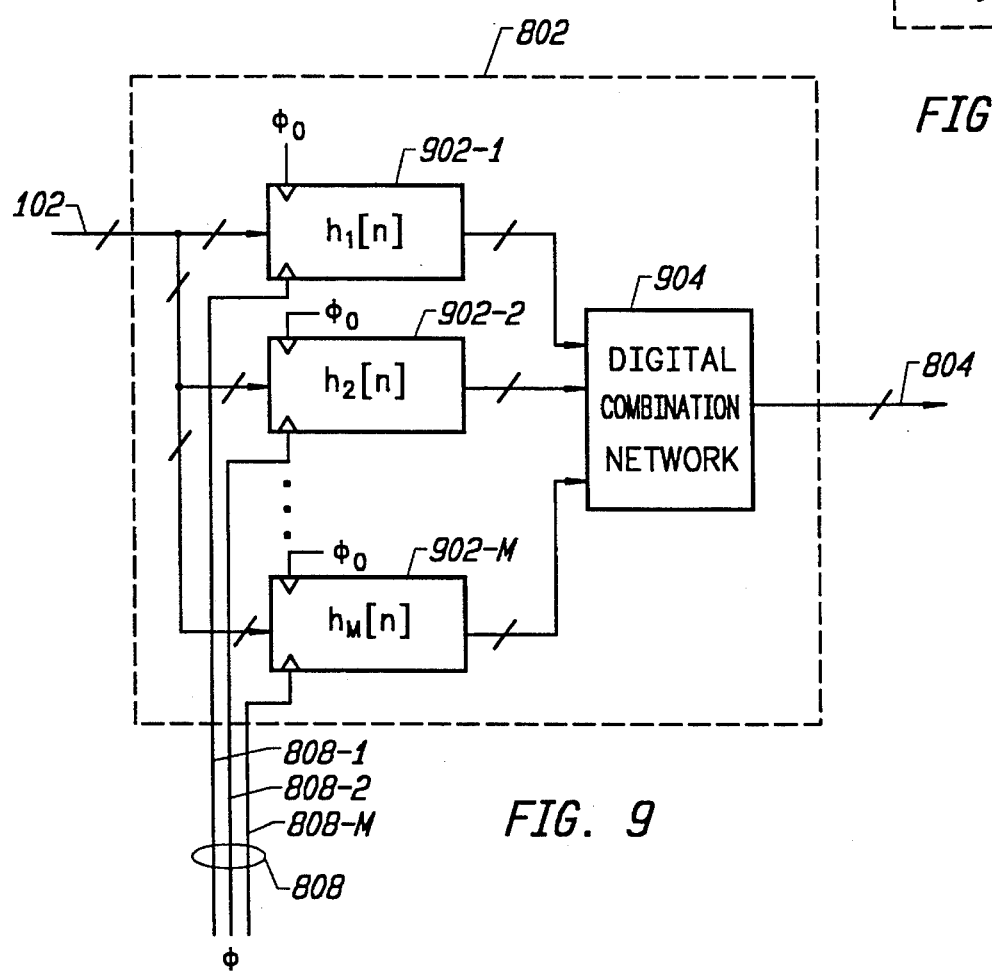
FIG. 9 is a functional block diagram of an implementation of the filter shown in FIG. 8.

FIGS. 8, 9 and 10 illustrate yet another aspect of the invention. The input signal arrives on bus 102 with samples occurring in coordination with the effective edges of an input sample clock operating at a frequency $F_S$. The sampled input signal is provided to a filter 802, the output of which is provided over a bus 804 to the input of a single DAC 810. The analog output of DAC 810 is provided over line 812 to a reconstruction filter 112 to provide the output of the system. The filter 802 receives the system clock signal $\phi_0$, operating at $F_S$, and also receives a generated clock signal $\phi$, over clock bus 808, having M effective clock edges for each effective clock edge of $\phi_0$, M>1. Clock generator 806 generates the generated clock signal $\phi$ in response to the system clock signal $\phi_0$. As with other embodiments described herein, the $\phi_0$ signal is provided to filter 802 so that an initial part of the filter can operate in response to the effective edges of $\phi_0$. Filter 802 updates its output M times for each effective clock edge of $\phi_0$. If the time duration of all of the output samples are equal, then the DAC 810 should be chosen or manufactured to be able to operate at a conversion rate no slower than $MF_S$. An arrangement such as that shown in FIG. 8 can be useful, for example, in situations where DACs continue to be large, and it is less expensive to use one higher frequency DAC than it is to use M DACs each operating at the system clock frequency $F_S$. A disadvantage of the FIG. 8 arrangement is that it does not reduce the glitch noise by a factor of 1/M, as does the FIG. 1 arrangement. The FIG. 8 arrangement also does not avoid generation of an $MF_S$ clock signal.

The frequency $F_S$ is referred to with respect to FIG. 8 as the system clock frequency not only because samples arrive on bus 102 at that frequency, but also because in a typical conventional integrated circuit with a DAC output, samples are presented to the DAC at the highest clock frequency present anywhere on the chip. Such a clock frequency is typically chosen as the highest frequency which can safely accommodate the longest combinatorial path in the circuit. The arrangement of FIG. 8 permits the sample frequency to be boosted to even higher frequencies prior to the DAC to thereby further simplify the reconstruction filter 112.

In general, M need not be an integer and need not be greater than 1. Where M is an integer greater than 1, FIG. 9 illustrates how the filter 802 can be implemented without requiring the use of digital circuitry operating faster than $F_S$. As shown in FIG. 9, filter 802 comprises a plurality of parallel sub-filters 902-1, 902-2, . . . 902-M, collectively 902. Each of the sub-filters 902 receives the sampled input signal from bus 102, and generates a sampled output signal. The clock generator 806 generates the generated clock signal $\phi$ over M separate leads 808-1, 808-2, . . . 808-M, each of which clocks a respective one of the sub-filters 902. Preferably but not essentially, the effective edges of the clock sub-signals on lines 808 occur at equally spaced intervals within each cycle of $\phi_0$. In the manner previously described, each of the sub-filters 902 can also have an initial portion clocked with $\phi_0$. Note that if desired, one or more of the sub-filters 902 can itself comprise more than one sub-filter.

The outputs of the sub-filters 902 are all combined by a digital combination network 904 to provide the output of filter 802 over bus 804. The digital combination network 904 updates its output in response to each effective edge of each of the clock sub-signals arriving on clock bus 808, yet none of the clocked circuitry in filter 802 needs to operate at a clock speed higher than $F_S$.

As mentioned, clock generator 806 can comprise a phase lock loop. Alternatively, for M=2, clock generator 806 can comprise merely a single invertor. As shown in FIG. 10, such a clock generator 806 contains invertor 1004, the input of which is connected to receive $\phi_0$ and the output of which drives one of the clock sub-signals 1002-2. The clock generator in FIG. 10 generates the other clock sub-signal 1002-1 merely as a pass-through from $\phi_0$.

The benefits of the invention can include the following, among other things, although not all embodiments need produce all of these benefits:

(1) reduced reconstruction filter requirement (many benefits);

(2) reduced signal noise (more transitional quantization levels);

(3) reduced high frequency noise (odd harmonics attenuated); and (4) reduced DAC glitch noise.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. For example, the invention can be used to implement both finite-impulse-response (FIR) filter transfer functions as well as infinite impulse response (IIR) filter transfer functions. It is intended that the scope of the invention be defined by the following claims and their equivalents.

What is claimed is:

1. Apparatus for use with a sampled input signal having an input sampling frequency $F_S$, the samples of said output signal occurring in coordination with an input sample clock having a plurality of phases, comprising:

M digital filters, each receiving said input signal, each m'th one of said filters having a respective impulse response $h_m(n)$ and producing a respective output signal updated at said input sample frequency $F_S$, each m'th one of said filters updating its output signal in time for a respective m'th one of the phase of said input sample clock, M≧2; and means for combining the output signals of said digital filters to produce a combined output signal having a sample rate of at least $MF_S$.

2. Apparatus according to claim 1, wherein the phase of said input sample clock divide each period of said input sample clock equally.

3. Apparatus according to claim 1, wherein M=2.

4. Apparatus according to claim 3, wherein said input sample clock has alternating rising and falling edges, wherein one of said filters updates its output signal in time for each rising edge of said input sample clock, and wherein the other of said filters updates its output signal in time for each falling edge of said input sample clock.

5. Apparatus according to claim 4, wherein said means for combining comprises:

a digital circuit receiving the output signals of both of said digital filters and producing a weighted sum thereof, said weighted sum being updated in time for each edge of said input sample clock; and a digital to analog converter (DAC) having a digital input port receiving said weighted sum and generating an analog output signal which is updated in response to each edge of said input sample clock.

6. Apparatus according to claim 5, wherein said input sample clock has a duty cycle of approximately 50%.

7. Apparatus according to claim 1, wherein a first one of said digital filters comprises:

P sub-filters, each receiving said input signal, each p'th one of said sub-filters having a respective impulse response $h_{1,p}(n)$ and producing a respective output signal updated at said input sample frequency $F_S$, each of said sub-filters updating its output signal in time for a first one of said input sample clock phases, P>1; and means for combining the output signals of said sub-filters to produce the output signal of the first digital filter.

8. Apparatus according to claim 7, wherein said means for combining the output signals of said sub-filters comprises an adder having P input ports and an output port, each p'th one of the input ports receiving the output of the p'th one of the sub-filters, and said output port of said adder carrying the output of the first digital filter.

9. Apparatus according to claim 1, wherein said means for combining the output signals combines the output signals linearly.

10. Apparatus according to claim 1, wherein said apparatus has a combined impulse response $$h(n) = \sum_{m=1}^{M} K_m h_m(n),$$

and wherein h(n) is mathematically equivalent to a finite impulse response filter having M taps and wherein $K_m$ is a coefficient for the m'th one of the taps.

11. Apparatus according to claim 1, wherein said apparatus has a combined impulse response $$h(n) = \sum_{m=1}^{M} K_m h_m(n),$$

and wherein h(n) is mathematically equivalent to a finite impulse response filter having more than M taps and wherein $K_m$ is a coefficient for the m'th one of the taps.

12. Apparatus according to claim 1, wherein said means for combining comprises:

M digital to analog converters (DACs), each having a digital input port and an analog output port, and producing on its analog output port an analog output signal having a value responsive to the digital value on its input port, each m'th one of said DACs receiving on its input port the output signal of the m'th one of said digital filters; and analog means for summing the analog signals produced by said DACs.

13. Apparatus according to claim 12, wherein said analog signals produced by said DACs are current signals, and wherein said means for summing comprises a node coupled to receive the current output signals from said DACs.

14. Apparatus according to claim 12, wherein each of said DACs further has an analog reference input port receiving a respective analog reference value, the current output of each of said DACs being proportional, by a constant of proportionality common to all of said DACs, to the value on the digital input port of the DAC times the respective analog reference value, wherein each of the analog reference values is proportional to a respective linear weighting constant $K_m$.

15. Apparatus according to claim 1, wherein the output signals of said digital filters each have a width of one bit, and wherein said means for combining comprises:

M digital to analog converters DACs, each having a 1-bit wide digital input port and an output, each m'th one of said DACs receiving on its input port the output signal of the m'th one of said digital filters; and an analog adder which receives and sums the outputs of said DACs.

16. Apparatus according to claim 1, wherein said digital filters, as combined through said means for combining, form the mathematical equivalent of a combined filter having a combined impulse response measure at a sampling rate $MF_S$ of $$h(n) = \sum_{m=1}^{M} K_m h_m(n),$$

and wherein the frequency response of h(n) has high attenuation at $F_S$ and wherein $K_m$ is a coefficient for the impulse response of the m'th one of the digital filters.

17. Apparatus according to claim 16, wherein the combined impulse response h(n) at 2Fs consist of a sequence of four samples whose values are in proportions of 0.125, 0.375, 0.375 and 0.125, respectively.

18. Apparatus according to claim 17, wherein M=2, wherein $K_2/K_1=2$, wherein the impulse response $h_1(n)$ at $2F_S$ consists of four equal sequential sample values k, and wherein the impulse response $h_2(n)$ at $2F_S$ consists of four sequential sample values of 0, k, k, 0 respectively.

19. Apparatus according to claim 1, wherein M=2, wherein said input sample clock has edge transitions of altering first and second polarities and said input signal is updated in time for each edge transition of said input sample clock which has said first polarity, wherein the first digital filter comprises:

a register having an input port coupled to receive said input signal and having an output, said register updating its output in response to each edge transition of said input sample clock which has said first polarity;

said first digital filter further comprising an adder having a first input port coupled to receive said input signal, a second input port coupled to receive the register output, and an output, wherein the second digital filter comprises said register, and wherein said means for combining comprises:

a first digital-to-analog converter (DAC) having a digital input port coupled to receive the adder output and having a current output port, said first DAC producing on its current output port a signal having a current level which is proportional by a constant of proportionality k to one-half the value on the adder output, said first DAC being clocked in response to each edge transition of said input clock signal which has said first polarity;

said means for combining further comprising a second DAC having a digital input port coupled to receive the register output and having a current output port, said second DAC producing on its current output port a signal having a current level which is proportional by said constant of proportionality k to the value on the register output, said second DAC being clocked in response to each edge transition of said input clock signal which has said second plurality;

and said means for combining further comprising a current summing node coupled to receive the current outputs of said first and second DACs.

20. Apparatus according to claim 19, wherein said adder further has a carry input coupled to receive a logic 1.

21. Apparatus according to claim 19, further comprising:

a resistor coupled between said current summing node and a fixed potential; and a capacitor coupled between said current summing node and a fixed potential.

22. A discrete time filter, for use with a sampled input signal and for producing a sampled analog output signal, comprising:

P primary filters each coupled to receive said sampled input signal and each producing a respective sample output signal, P>1;

M digital-to-analog converters (DACs) each having a digital input port and an analog output port and having respective analog conversion gains $a_m$, 1<M≤P;

a first combination network having P input ports, each coupled to receive the output of a respective one of said primary filters, said combination network also having M output ports, each coupled to a respective one of the DAC input ports, said first combination network producing values on said M output ports from combinations of the values on said P input ports; and a second combination network coupled to receive the analog outputs of each of said DACs and providing a combined analog output signal as a combination of the DAC outputs.

23. A discrete time filter according to claim 22, wherein said discrete time filter is a finite impulse response filter.

24. A discrete time filter according to claim 22, wherein said sampled input signal is a sampled digital input signal, wherein said P primary filters are digital filters,
and wherein said first combination network is a digital combination network.

25. Apparatus for use with an input sample clock having $F_S$ effective edges per unit time, for use further with a sample input signal having samples which occur in coordination with said effective edges of said input sample clock, comprising:

a clock generator coupled to receive said input sample clock and generating a generated clock signal having $MF_S$ effective edges per said unit time in response to said input sample clock, M<0 and M≠1;

a discrete time filter coupled to receive said sampled input signal and said generated clock signal, and producing an output signal updated at the frequency MFs; and a digital to analog converter (DAC) coupled to receive the output signal of said filter and to produce an analog output signal in response thereto.

26. Apparatus according to claim 25, wherein M is an integer.

27. Apparatus according to claim 26, wherein said generated clock signal comprises M clock sub-signals, each of said clock sub-signals having $F_S$ effective edges per said unit time, the effective edges of different ones of said clock sub-signals occurring at different times relative to the effective edges of said input sample clock.

28. Apparatus according to claim 27, wherein said filter comprises:

M sub-filters each coupled to receive said sampled input signal and a respective one of said clock sub-signals, and producing a respective output signal updated in response to each effective edge of the respective clock sub-signal; and a combination network coupled to provide as the filter output a combination of the sub-filter output signals.

29. Apparatus according to claim 25, wherein M=2.

30. Apparatus according to claim 25, wherein said input sample clock has alternating rising and falling edges, and wherein said clock generator produces one of said effective edges in the generated clock signal in response to each of said rising and falling edges in said input sample clock.

31. Apparatus according to claim 30, wherein the generated clock signal comprises first and second clock sub-signals, said clock generator producing said first clock sub-signal with only those effective edges of the generated clock signal which are produced in response to the rising edge of said input clock signal, and producing said second clock sub-signal with only those effective edges of the generated clock signal which are produced in response to the falling edge of said input clock signal.

32. Apparatus according to claim 31, wherein said filter comprises:

a first sub-filter coupled to receive said sampled input signal and said first clock sub-signal, said first sub-filter producing an output signal updated in response to each effective edge of said first clock sub-signal;

a second sub-filter coupled to receive said sampled input signal and said second clock sub-signal, said second sub-filter producing an output signal updated in response to each effective edge of said second clock sub-signal; and a combination network coupled to provide as the filter output a combination of the first and second sub-filter output signals.

33. A method for filtering a sampled input signal having a sampling frequency $F_S$, the samples of said input signal occurring in coordination with an input sample clock having a plurality of phases, comprising the steps of:

digitally filtering said input signal through M filters to produce M respective output signals, each m'th one of said output signals being updated at said sampling frequency $F_S$, each m'th one of said filters updating its output of said input sample clock, M≧2; and combining said output signals of the filters to produce a combined output signal having a sample rate of at least $MF_S$.

34. A method for filtering a sampled input signal, comprising the steps of:

filtering said input signal through P filters, each producing a respective output signal, P>1;

combining the output signals of said P filters to produce M intermediate signals, 1<M≦P;

converting each of said M intermediate signals to a respective analog signal; and combining said analog signals.

35. A method according to claim 34, wherein said sampled input signal is a sampled digital input signal, wherein said step of filtering said input signal through P filters comprises a step of digitally filtering said input signal through P filters, each producing a respective digital output signal;

and wherein said step of combining the output signals of said P filters comprises a step of digitally combining the output signals of said P filters, said M intermediate signals being digital.

36. A method according to claim 34, wherein said method yields an overall filter transfer function whose impulse response is finite in duration.

37. A method for filtering a sampled input signal to produce an analog output signal, for use with an input sample clock having $F_S$ effective edges per unit time, the samples of said sampled input signal occurring in coordination with said effective edges of said input sample clock, comprising to steps of:

generating a generated clock signal having $MF_S$ effective edges per said unit time in response to said input sample clock, M>0 and M≠1;

discrete-time filtering said sampled input signal to produce a filtered output signal updated in response to each effective edge of said generated clock signal; and converting said filtered output signal to said analog Output signal.

* * * * *

UNITED STATES PATENT AND TRADEMARK OFFICE
CERTIFICATE OF CORRECTION

PATENT NO. : 5,521,946  
DATED : May 28, 1996  
INVENTOR(S) : David R. Main

Page 1 of 2

It is certified that error appears in the above-indentified patent and that said Letters Patent is hereby corrected as shown below:

Col. 12, claim 1, line 11, please delete "phase" and insert therefor --phases--.

Col. 12, claim 1, line 17, please delete "phase" and insert therefor --phases--.

Col. 13, claim 17, line 54, please delete "consist" and insert therefor --consists--.

Col. 14, claim 22, line 48, please delete "sample" and insert therefor --sampled--.

Col. 15, claim 25, line 5, please delete "sample" and insert therefor --sampled--.

Col. 15, claim 25, line 12, please delete "$<$" and insert therefor --$>$--.

Col. 16, claim 33, line 15, after "output", please insert --signal in time for a respective m'th one of the phases--.

UNITED STATES PATENT AND TRADEMARK OFFICE
CERTIFICATE OF CORRECTION

PATENT NO. : 5,521,946
DATED : May 28, 1996
INVENTOR(S) : David R. Main

It is certified that error appears in the above-indentified patent and that said Letters Patent is hereby corrected as shown below:

Col. 16, claim 37, line 57, please delete "Out-" and insert therefor --out--.

Signed and Sealed this

Twelfth Day of November, 1996

Attest:

BRUCE LEHMAN

Attesting Officer        Commissioner of Patents and Trademarks